(12) United States Patent
Qian

(10) Patent No.: US 9,311,849 B2
(45) Date of Patent: Apr. 12, 2016

(54) INVERTER, AMOLED COMPENSATION CIRCUIT AND DISPLAY PANEL

(71) Applicant: Shanghai Tianma Micro-Electronics Co., Ltd., Shanghai (CN)

(72) Inventor: Dong Qian, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 60 days.

(21) Appl. No.: 14/062,726

(22) Filed: Oct. 24, 2013

(65) Prior Publication Data

US 2014/0145919 A1    May 29, 2014

(30) Foreign Application Priority Data

Nov. 21, 2012   (CN) .......................... 2012 1 0476968

(51) Int. Cl.
*G09G 3/32* (2006.01)
*H03K 19/00* (2006.01)
*H03K 3/012* (2006.01)

(52) U.S. Cl.
CPC .............. *G09G 3/3225* (2013.01); *H03K 3/012* (2013.01); *H03K 19/0016* (2013.01); *H03K 19/0027* (2013.01)

(58) Field of Classification Search
CPC ......... G09G 3/00; G09G 3/32; G09G 3/3208; G09G 3/3225; G09G 2310/0264; H03K 3/012; H03K 17/161; H03K 19/0016; H03K 19/0017; H03K 19/003
See application file for complete search history.

(56) References Cited

U.S. PATENT DOCUMENTS

| | | | |
|---|---|---|---|
| 6,813,332 | B2 | 11/2004 | Nagao et al. |
| 7,920,109 | B2 * | 4/2011 | Chung ............................. 345/82 |
| 2005/0253791 | A1 * | 11/2005 | Shin ................................. 345/76 |
| 2007/0063933 | A1 * | 3/2007 | Chung ............................. 345/76 |
| 2007/0242000 | A1 * | 10/2007 | Shin ................................. 345/76 |
| 2008/0123799 | A1 * | 5/2008 | Otose ............................. 377/68 |
| 2009/0225068 | A1 * | 9/2009 | Jeong et al. ................... 345/211 |
| 2012/0206432 | A1 * | 8/2012 | Kang et al. .................... 345/212 |
| 2013/0222352 | A1 * | 8/2013 | Jeong ............................ 345/205 |

FOREIGN PATENT DOCUMENTS

EP    1 763 003 A2    3/2007

\* cited by examiner

*Primary Examiner* — Joe H Cheng
(74) *Attorney, Agent, or Firm* — Kilpatrick Townsend & Stockton LLP

(57) ABSTRACT

An inverter is disclosed. The disclosed inverter includes first, second, third, and fourth transistors, where each of the first, second, third, and fourth transistors is a P-type thin film transistor. The inverter also includes a first capacitor. The inverter allows for wide voltage output swing performance and low power consumption.

6 Claims, 3 Drawing Sheets

INVERTER, AMOLED COMPENSATION CIRCUIT AND DISPLAY PANEL

CROSS-REFERENCES TO RELATED APPLICATIONS

The present application claims priority to Chinese patent application No. 201210476968.2, entitled "INVERTER, AMOLED COMPENSATION CIRCUIT AND DISPLAY PANEL", filed with the State Intellectual Property Office of People's Republic of China on Nov. 21, 2012, the contents of which is incorporated herein by reference in its entirety.

FIELD

The present invention relates to the field of OLED display technologies and particularly to an inverter, an AMOLED compensation circuit and a display panel.

BACKGROUND OF THE INVENTION

In recent years, in the field of image display devices, an optical device driven by current has been developed. The luminance of emitting light of an optical device driven by current varies with the strength of current flowing therethrough. For example, Organic Light-Emitting Diode (OLED) devices are display devices emitting light in pixels. Unlike liquid crystal display devices, the OLED devices are self light-emitting devices, and in a display device using OLED, color grades are achieved by controlling the magnitude of current in the OLED.

Like a liquid crystal display, there is a passive matrix system and an active matrix system for a drive system in an OLED display device. The passive matrix system is structurally simple but has a few drawbacks, such as being difficult to produce a large and high-resolution display device, so the active matrix system is under prevailing development. In the active matrix system, current in a light-emitting device arranged for each pixel is controlled by a drive transistor.

At present, in the design of an Active Matrix Organic Light-Emitting Diodes (AMOLED) display panel, particularly in the design of a large-size substrate, non-uniformity of current in OLEDs results from non-uniformity and instability in preparation process of manufacturing thin film transistors (TFTs) on the panel. In order to compensate for a threshold voltage shift (Vth shift) due to the non-uniformity of TFTs manufactured in a substrate production process and to overcome the shortcoming of a decline in stability of the TFTs due to a bias voltage caused by long-time switching on status of the TFTs, the design of a compensation circuit is desirable. In the prior art, a drive circuit with pure PMOS TFTs is used in which a valid potential output is at a low potential, but an OLED device should be switched off in processes of node initialization, threshold detection and data input. However for the pure PMOS circuit in which only PMOS TFTs are used, a TFT is switched on in the case that its gate is at a low voltage and switched off in the case that the gate is at a high voltage; and the pure PMOS drive circuit outputs a valid level typically at a low level, so it is necessary to invert a signal output from the pure PMOS drive circuit so as to have the OLED switched off. In the prior art, signal inversion is achieved by using a light-emitting control (EMIT) drive circuit.

For inversion of a low potential to a high potential, an inverter is proposed in the prior art, which is structured as illustrated in FIG. 1A. The inverter comprises two P-type TFT, wherein the first TFT has its gate connected with an input terminal IN, has its source connected with a high voltage signal (VGH) and has its drain connected with an output terminal (OUT). The second TFT has its gate and drain connected with a low voltage signal (VGL) and has its source connected with the output terminal OUT. FIG. 1B is a timing control diagram of the circuit illustrated in FIG. 1A. With reference to FIG. 1A and FIG. 1B, the first TFT is switched off when IN is at a high potential, and since the second TFT is diode connected, (the second TFT has both its gate and its drain connected with the low voltage signal VGL as mentioned above), a low potential which is higher than VGL by Vth is output by the output terminal OUT and when IN is at a low potential, both the first TFT and the second TFT are switched on, so a high potential is output by the output terminal OUT. However in the foregoing circuit, the output terminal OUT is connected with both VGH and VGL, and if the TFTs are switched on or off completely, then the output terminal OUT should be connected either with VGH or with VGL, and thus the voltage output by the output terminal should be either VGH as a high voltage or VGL as a low voltage. But the forgoing circuit suffers from the problem of both the two TFTs being switched on at the same time, and the voltage output by the output terminal OUT is at a potential between the high voltage and the low voltage due to voltage division. As a result, the high or low potential at which the voltage is output lies between the high voltage and low voltage, thus making the high or low potential output insufficient, resulting in a continuous power supply and increasing power consumption. In addition, the output potential is not sufficient (for example, an input voltage of $-5V\sim10V$ may generate an output voltage of $-4.43V\sim5.07V$), failing to effectively control TFTs in a pixel, thus making the compensation circuit fail to operate effectively.

BRIEF SUMMARY OF THE INVENTION

One inventive aspect is an inverter. The inverter includes first, second, third, and fourth transistors, where each of the first, second, third, and fourth transistors is a P-type thin film transistor, and a first capacitor. A gate of the first transistor is connected with a gate of the third transistor, and the gate of the first transistor and the gate of the third transistor are connected to an input terminal of a first signal. A source of the first transistor is connected with a source of the third transistor, and the source of the first transistor and the source of the third transistor are connected to an input terminal of a second signal. A drain of the first transistor is connected with a gate of the fourth transistor and a source of the second transistor at a first node, where a gate of the second transistor is connected with an input terminal of a second clock signal, a drain of the second transistor is connected with a drain of the fourth transistor, and the drain of the second transistor and the drain of the fourth transistor are connected to an input terminal of a third signal. A drain of the third transistor is connected with a source of the fourth transistor, and the drain of the third transistor and the source of the fourth transistor are connected to a signal output terminal of the inverter. The first capacitor has one terminal connected with the first node and has another terminal connected with an input terminal of a first clock signal, and where a high voltage signal is input to the input terminal of the second signal, and a low voltage signal is input to the input terminal of the third signal.

Another inventive aspect is a compensation circuit of an active matrix organic light-emitting diode display panel. The circuit includes an inverter. The inverter includes first, second, third, and fourth transistors, where each of the first, second, third, and fourth transistors is a P-type thin film transistor, and a first capacitor. A gate of the first transistor is connected with a gate of the third transistor, and the gate of the first transistor and the gate of the third transistor are connected to an input terminal of a first signal. A source of the first transistor is connected with a source of the third transistor, and the source of the first transistor and the source of the third transistor are connected to an input terminal of a second signal. A drain of the first transistor is connected with a gate of the fourth transistor and a source of the second transistor at a first node, where a gate of the second transistor is connected with an input terminal of a second clock signal, a drain of the second transistor is connected with a drain of the fourth transistor, and the drain of the second transistor and the drain of the fourth transistor are connected to an input terminal of a third signal. A drain of the third transistor is connected with a source of the fourth transistor, and the drain of the third transistor and the source of the fourth transistor are connected to a signal output terminal of the inverter. The first capacitor has one terminal connected with the first node and has another terminal connected with an input terminal of a first clock signal, and where a high voltage signal is input to the input terminal of the second signal, and a low voltage signal is input to the input terminal of the third signal.

Another inventive aspect is a display panel, including a compensation circuit for an active matrix organic light-emitting diodes display panel. The compensation circuit includes an inverter. The inverter includes first, second, third, and fourth transistors, where each of the first, second, third, and fourth transistors is a P-type thin film transistor, and a first capacitor. A gate of the first transistor is connected with a gate of the third transistor, and the gate of the first transistor and the gate of the third transistor are connected to an input terminal of a first signal. A source of the first transistor is connected with a source of the third transistor, and the source of the first transistor and the source of the third transistor are connected to an input terminal of a second signal. A drain of the first transistor is connected with a gate of the fourth transistor and a source of the second transistor at a first node, where a gate of the second transistor is connected with an input terminal of a second clock signal, a drain of the second transistor is connected with a drain of the fourth transistor, and the drain of the second transistor and the drain of the fourth transistor are connected to an input terminal of a third signal. A drain of the third transistor is connected with a source of the fourth transistor, and the drain of the third transistor and the source of the fourth transistor are connected to a signal output terminal of the inverter. The first capacitor has one terminal connected with the first node and has another terminal connected with an input terminal of a first clock signal, and where a high voltage signal is input to the input terminal of the second signal, and a low voltage signal is input to the input terminal of the third signal.

BRIEF DESCRIPTION OF THE DRAWINGS

The drawings described here serve to provide further understanding of the invention, and exemplary embodiments of the invention and the description thereof serve to explain the invention but will not limit the invention unduly. In the drawings.

DETAILED DESCRIPTION OF THE INVENTION

In order to lower power consumption of a circuit in a process of inverting an output signal while ensuring an output potential to satisfy a demand for pixel control, embodiments of the invention provide an inverter, an AMOLED compensation circuit and a display panel.

Preferred embodiments of the invention will be explained below with reference to the drawings, and it shall be appreciated that the preferred embodiments described here are merely intended to explain and elaborate but not limit the invention and that the embodiments in the invention and features in the embodiments can be combined with each other unless they contradict with each other.

First Embodiment

Figure 1A:
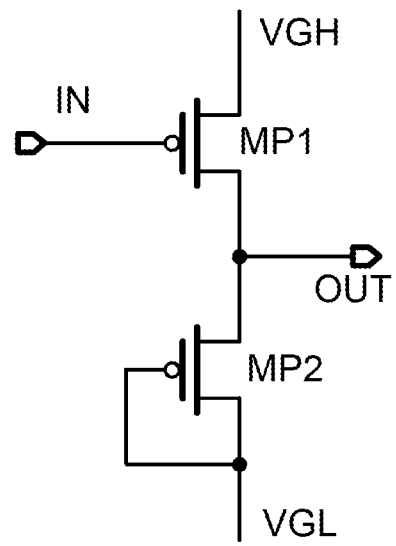
FIG. 1A is a schematic structural diagram of an inverter in the prior art.
Figure 1B:
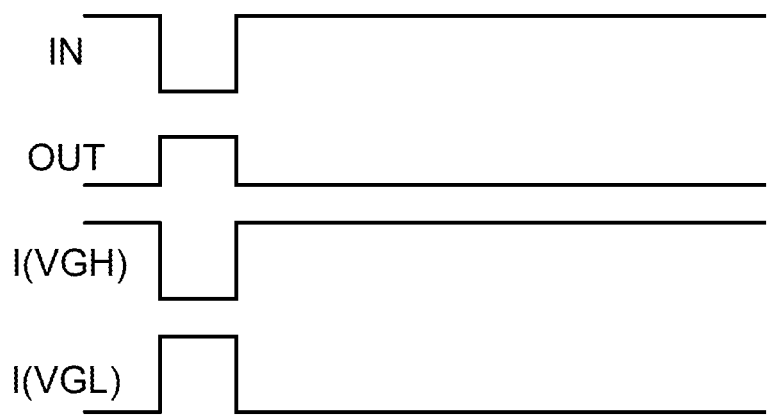
FIG. 1B is a schematic timing control diagram of the inverter circuit in FIG. 1A in the prior art.
Figure 2A:
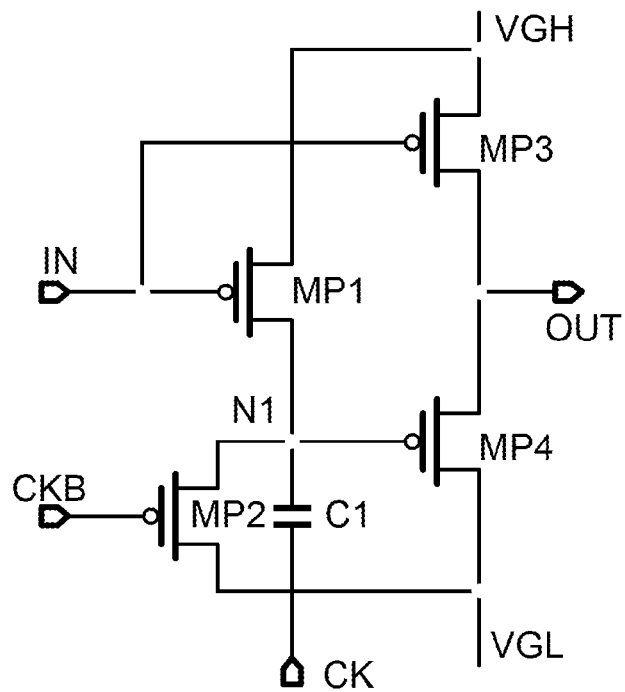
FIG. 2A is schematic structural diagram of a first inverter in an embodiment of the invention.

As illustrated in FIG. 2A which is schematic structural diagram of a first inverter in an embodiment of the invention. The first inverter comprises a first transistor MP1, a second transistor MP2, a third transistor MP3, a fourth transistor MP4 and a first capacitor C1.

A gate of the first transistor MP1 is connected with a gate of the third transistor MP3, and the gate of the first transistor MP1 and the gate of the third transistor MP3 have a common terminal which is used as an input terminal of a first signal IN. A source of the first transistor MP1 is connected with a source of the third transistor MP3, and the source of the first transistor MP1 and the source of the third transistor MP3 are used as an input terminal VGH of a second signal. And a drain of the first transistor MP1 is connected with a gate of the fourth transistor MP4 and a source of the second transistor MP2 at a first node N1, wherein, a high voltage signal is input to the input terminal VGH of the second signal.

A gate of the second transistor MP2 is connected with an input terminal of a second clock signal input, a drain of the second transistor MP2 is connected a the drain of the fourth transistor MP4, and the drain of the second transistor MP2 and the drain of the fourth transistor MP4 have a common terminal which is used as an input terminal VGL of a third signal, wherein a low voltage signal is input to the input terminal VGL of the third signal.

A drain of the third transistor MP3 is connected with a source of the fourth transistor MP4, and the drain of the third transistor MP3 and the source of the fourth transistor MP4 have a common terminal which is used as a signal output terminal OUT of the inverter.

The first capacitor C1 has one terminal connected with the first node N1 and has the other terminal with an input terminal CK of a first clock signal.

Figure 2B:
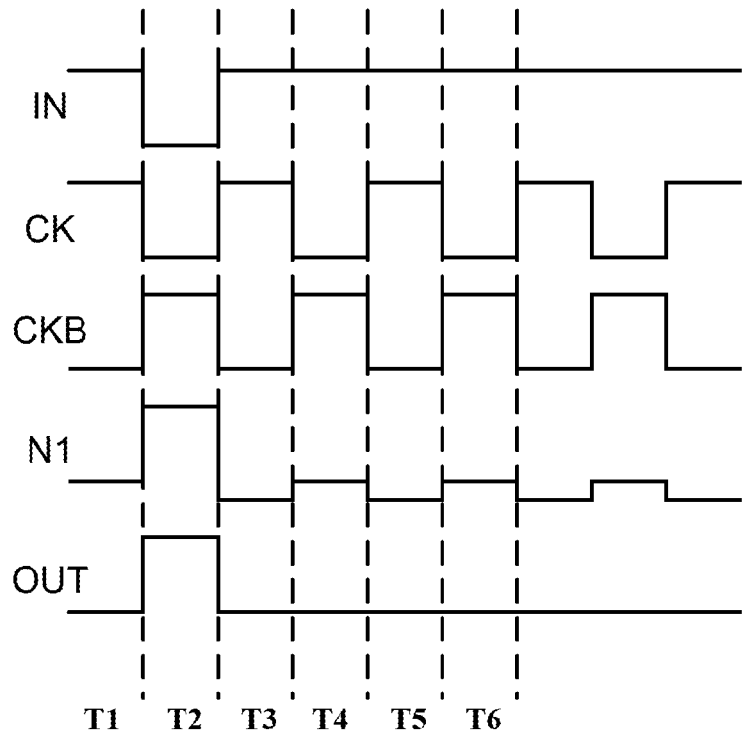
FIG. 2B is a schematic timing control diagram of the inverter circuit in FIG. 2A in the embodiment of the invention.

Referring to FIG. 2B which is a schematic timing control diagram of the inverter circuit in FIG. 2A.

During a first period of time T1, a high potential is input to the input terminal IN of the first signal and the input terminal CK of the first clock signal, and a low potential is input to an input terminal CKB of a second clock signal, then the first transistor MP1 and the third transistor MP3 are switched off, and the second transistor MP2 and the fourth transistor MP4 are switched on. Since the second transistor MP2 is switched on, the first node N1 is connected to the input terminal VGL of the third signal, and also since the fourth transistor MP4 is switched on and the third transistor MP3 is switched off, a low potential is output to the signal output terminal OUT.

During a second period of time T2, a low potential is input to the input terminal IN of the first signal and the input terminal CK of the first clock signal, and a high potential is input to the input terminal CKB of the second clock signal, then the first transistor MP1 and the third transistor MP3 are switched on, and the second transistor MP2 and the fourth transistor MP4 are switched off. At this time, since the first transistor MP1 is switched on, the first node N1 is connected to the input terminal VGH of the second signal, and also since the third transistor MP3 is switched on, a high potential is output to the signal output terminal OUT.

During a third period of time T3, a high potential is input to the input terminal IN of the first signal and the input terminal CK of the first clock signal, and a low potential is input to the input terminal CKB of the second clock signal, then the first transistor MP1 and the third transistor MP3 are switched off, and the second transistor MP2 and the fourth transistor MP4 are switched on. At this time, like during the first period of time T1, since the second transistor MP2 is switched on, the first node N1 is connected to the input terminal VGL of the third signal, and also since the fourth transistor MP4 is switched on and the third transistor MP3 is switched off, a low potential is output to the signal output terminal OUT;

During the period of T1~T3, potentials at both terminals of the first capacitor C1 are changeable for which the charge conservation law is not met. The potentials at the upper terminal and lower terminal of the first capacitor are charged during the third period of time T3 respectively to a low potential and a high potential.

During a fourth period of time T4, a high potential is input to the input terminal IN of the first signal, a low potential is input to the input terminal CK of the first clock signal, and a high potential is input to the input terminal CKB of the second clock signal, then the first transistor MP1 and the third transistor MP3 are switched off, and the second transistor MP2 is also switched off, therefore the first capacitor has no signal input to the upper terminal while its lower terminal is connected with the input terminal CK of the first clock signal. At this time, the signals to both terminals of the first capacitor will not simultaneously change, which otherwise results in a change in total amount of charge, so the first capacitor C1 meets the charge conservation law. Since the low potential is input to the input terminal CK of the first clock signal, the potential of the lower terminal of the first capacitor C1 drops, but the voltage between the two terminals of the first capacitor C1 will not change suddenly for the sake of charge conservation law. Therefore the potential of the upper terminal of the first capacitor is pulled down, in other words, the potential of the first node N1 is pulled down, which has the fourth transistor MP4 switched on, further causing a low potential being output to the signal output terminal OUT and having the signal output terminal OUT connected with VGL. Thus, the voltage of the VGL can be output completely by the signal output terminal OUT to thereby avoid the undesired phenomenon in the prior art of a potential failing to reach a preset voltage.

At subsequent periods of time, a high potential is input to the input terminal IN of the first signal, and a high potential and a low potential are input alternatively to the input terminal CK of the first clock signal and to the input terminal CKB of the second clock signal, while maintaining all the time the upper terminal of the first capacitor being at a low potential, that is, a low potential is always output to the signal output terminal OUT. For example, during a fifth period of time, a high potential is input to the input terminal IN of the first signal and the input terminal CK of the first clock signal, a low potential is input to the input terminal CKB of the second clock signal, and ultimately a low potential is output to the signal output terminal OUT, which is under the same operating principle as those during the first period of time T1 and the third period of time T3, and a repeated description thereof will be omitted here. During a sixth period of time, a high potential is input to the input terminal IN of the first signal, a low potential is input to the input terminal CK of the first clock signal, a high potential is input to the input terminal CKB of the second clock signal, and a low potential is ultimately output to the signal output terminal OUT, which is under the same operating principle as those during the fourth period of time T4, and a repeated description thereof will be omitted here. The foregoing times T5 and T6 are repeated as subsequent times, and a repeated description thereof will be omitted here.

In the foregoing process, both the first clock signal and the second clock signal serve to invert the first signal of the input terminal IN while controlling the output signal at a potential in a range of −5V~10V to thereby ensure the output potential to meet a demand for pixel control. Moreover, current in the input terminal VGH of a high voltage signal and current in the input terminal VGL of a low voltage signal will not be too high, thus reducing power consumption of the circuit.

Second Embodiment

Figure 3:
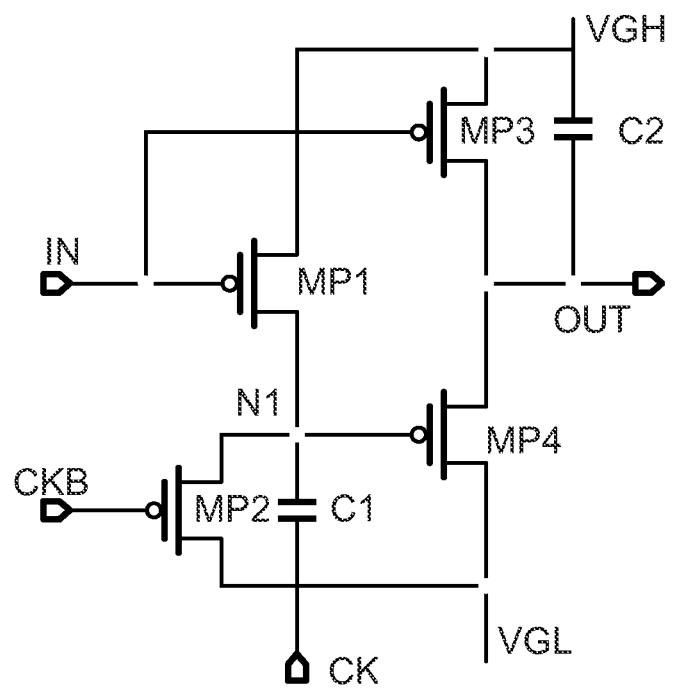
FIG. 3 is schematic structural diagram of a second inverter in an embodiment of the invention.

As illustrated in FIG. 3, on the basis of the inverter circuit according to the first embodiment, a second capacitor C2 is added in the second embodiment. One terminal of the second capacitor C2 is connected with the source of the third transistor MP3 and the other terminal is connected with the drain of the third transistor MP3 so that the problem of ripple of the output signal from the signal output terminal OUT due to the first clock signal from CK and the second clock signal from CKB is suppressed after the second period of time T2 to thereby make an output waveform from the signal output terminal OUT as smooth as possible.

In a particular implementation, the inverters according to the first embodiment or the second embodiment can be applied to a compensation circuit of an Active Matrix Organic Light-Emitting Diode (AMOLED) display panel in combination with a general PMOS drive circuit, where an output signal is inverted as a drive signal of an EMIT drive circuit to thereby reduce power consumption of the circuit while ensuring an output potential to meet a demand for pixel control.

It shall be noted that the Active Matrix Organic Light-Emitting Diode (AMOLED) display panel, a compensation circuit can be arranged in a display panel to compensate for a threshold voltage shift (Vth shift) due to the non-uniformity of TFTs manufactured in a panel production process and to overcome the shortcoming of a decline in stability of the TFTs due to a bias voltage caused by long-time switching on status of the TFTs.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Those skilled in the art can make various modifications and variations to the invention without departing from the spirit and scope of the invention. Thus the invention is also intended to encompass these modifications and variations thereto.

What is claimed is:

1. An inverter, comprising:
   a first, second, third, and fourth transistors, wherein each of the first, second, third, and fourth transistors is a P-type thin film transistor; and
   a first capacitor,
   wherein a gate of the first transistor is connected with a gate of the third transistor, and the gate of the first transistor and the gate of the third transistor are connected to an input terminal of a first signal,
   wherein a source of the first transistor is connected with a source of the third transistor, and the source of the first transistor and the source of the third transistor are connected to an input terminal of a second signal,
   wherein a drain of the first transistor is connected with a gate of the fourth transistor and a source of the second transistor at a first node,
   wherein a gate of the second transistor is connected with an input terminal of a second clock signal, a drain of the second transistor is connected with a drain of the fourth transistor, and the drain of the second transistor and the drain of the fourth transistor are connected to an input terminal of a third signal,
   wherein a drain of the third transistor is connected with a source of the fourth transistor, and the drain of the third transistor and the source of the fourth transistor are connected to a signal output terminal of the inverter,
   wherein the first capacitor has one terminal connected with the first node and has another terminal connected with an input terminal of a first clock signal, and
   wherein a high voltage signal is input to the input terminal of the second signal, and a low voltage signal is input to the input terminal of the third signal.

2. The inverter according to claim 1, further comprising a second capacitor, of which one terminal is connected with the source of the third transistor and another terminal is connected with the drain of the third transistor.

3. A compensation circuit of an active matrix organic light-emitting diode display panel, the circuit comprising:
   an inverter, comprising:
   a first, second, third, and fourth transistors, wherein each of the first, second, third, and fourth transistors is a P-type thin film transistor; and
   a first capacitor,
   wherein a gate of the first transistor is connected with a gate of the third transistor, and the gate of the first transistor and the gate of the third transistor are connected to an input terminal of a first signal,
   wherein a source of the first transistor is connected with a source of the third transistor, and the source of the first transistor and the source of the third transistor are connected to an input terminal of a second signal,
   wherein a drain of the first transistor is connected with a gate of the fourth transistor and a source of the second transistor at a first node,
   wherein a gate of the second transistor is connected with an input terminal of a second clock signal, a drain of the second transistor is connected with a drain of the fourth transistor, and the drain of the second transistor and the drain of the fourth transistor are connected to an input terminal of a third signal,
   wherein a drain of the third transistor is connected with a source of the fourth transistor, and the drain of the third transistor and the source of the fourth transistor are connected to a signal output terminal of the inverter,
   wherein the first capacitor has one terminal connected with the first node and has another terminal connected with an input terminal of a first clock signal, and
   wherein a high voltage signal is input to the input terminal of the second signal, and a low voltage signal is input to the input terminal of the third signal.

4. The compensation circuit according to claim 3, wherein the inverter further comprises a second capacitor, of which one terminal is connected with the source of the third transistor and another terminal is connected with the drain of the third transistor.

5. A display panel, comprising a compensation circuit for an active matrix organic light-emitting diodes display panel, wherein the compensation circuit comprises an inverter, the inverter comprising:
   a first, second, third, and fourth transistors, wherein each of the first, second, third, and fourth transistors is a P-type thin film transistor; and
   a first capacitor,
   wherein a gate of the first transistor is connected with a gate of the third transistor, and the gate of the first transistor and the gate of the third transistor are connected to an input terminal of a first signal,
   wherein a source of the first transistor is connected with a source of the third transistor, and the source of the first transistor and the source of the third transistor are connected to an input terminal of a second signal,
   wherein a drain of the first transistor is connected with a gate of the fourth transistor and a source of the second transistor at a first node,
   wherein a gate of the second transistor is connected with an input terminal of a second clock signal, a drain of the second transistor is connected with a drain of the fourth transistor, and the drain of the second transistor and the drain of the fourth transistor are connected to an input terminal of a third signal,
   wherein a drain of the third transistor is connected with a source of the fourth transistor, and the drain of the third transistor and the source of the fourth transistor are connected to a signal output terminal of the inverter,
   wherein the first capacitor has one terminal connected with the first node and has another terminal connected with an input terminal of a first clock signal, and
   wherein a high voltage signal is input to the input terminal of the second signal, and a low voltage signal is input to the input terminal of the third signal.

6. The display panel according to claim 5, wherein the inverter further comprises a second capacitor, of which one terminal is connected with the source of the third transistor and another terminal is connected with the drain of the third transistor.

* * * * *